US009985067B2

(12) United States Patent
Marion

(10) Patent No.: US 9,985,067 B2
(45) Date of Patent: May 29, 2018

(54) METHOD OF MANUFACTURING A PLURALITY OF ISLAND-SHAPED DIPOLES HAVING SELF-ALIGNED ELECTRODES

(71) Applicant: COMMISSARIAT A L'ENERGIE ATOMIQUE ET AUX ENERGIES ALTERNATIVES, Paris (FR)

(72) Inventor: François Marion, Saint Martin le Vinoux (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 17 days.

(21) Appl. No.: 15/186,936

(22) Filed: Jun. 20, 2016

(65) Prior Publication Data

US 2016/0380017 A1    Dec. 29, 2016

(30) Foreign Application Priority Data

Jun. 24, 2015   (FR) ...................................... 15 55785

(51) Int. Cl.
*H01L 27/146* (2006.01)
*H01L 27/144* (2006.01)

(52) U.S. Cl.
CPC .... *H01L 27/14632* (2013.01); *H01L 27/1446* (2013.01); *H01L 27/1462* (2013.01); *H01L 27/1469* (2013.01); *H01L 27/14634* (2013.01); *H01L 27/14636* (2013.01); *H01L 27/14643* (2013.01); *H01L 27/14687* (2013.01); *H01L 27/14698* (2013.01)

(58) Field of Classification Search
CPC ........... H01L 27/1446; H01L 27/14643; H01L 27/14698
See application file for complete search history.

(56) References Cited

U.S. PATENT DOCUMENTS

2014/0361327 A1* 12/2014 Chae ....................... H01L 33/22
                                                                257/98
2015/0115290 A1   4/2015 Guenard
2016/0204206 A1*  7/2016 Masuda ............... H01L 29/7813
                                                                257/77

FOREIGN PATENT DOCUMENTS

EP    2390933 A1    11/2011
FR    2184995 A1    12/1973

OTHER PUBLICATIONS

Search Report issued in French Pat. Appl. No. 1555785 dated Apr. 20, 2016.

(Continued)

*Primary Examiner* — Mounir Amer
(74) *Attorney, Agent, or Firm* — Marshall, Gerstein & Borun LLP

(57) ABSTRACT

An electronic component includes a plurality of dipoles, each comprising an island solid with a base, a first electrode arranged at the top of the island and a second electrode arranged on the base. Its manufacturing includes forming, on the base, a layer of a material capable of being etched by means of a predetermined isotropic etching, forming, over the layer of material, solid patterns made of electrically-conductive material and inert to said etching, applying the isotropic etching of the thickness of material between said solid patterns to form islands totally overlooked by said solid patterns, and depositing electrically-conductive material on top of and between the islands to form the first and second electrodes of the dipoles.

8 Claims, 9 Drawing Sheets

(56) References Cited

OTHER PUBLICATIONS

Liu et al., "A Novel BLU-Free Full-Color LED Projector Using LED on Silicon Micro-Displays," *IEEE Photonics Technology Letters*, vol. 25, No. 23 (Dec. 2013).
Liu et al., "360 PPI Flip-Chip Mounted Active Matrix Addressable Light Emitting Diode on Silicon (LEDoS) Micro-Displays," *Journal of Display Technology*, vol. 9, No. 8, (Aug. 2013).

\* cited by examiner

METHOD OF MANUFACTURING A PLURALITY OF ISLAND-SHAPED DIPOLES HAVING SELF-ALIGNED ELECTRODES

CROSS-REFERENCE TO RELATED APPLICATIONS

This application claims the benefit of priority under 35 U.S.C. § 119 of prior-filed French Patent Application No. 1555785, filed Jun. 24, 2015, the entire content of which is hereby incorporated herein by reference, in its entirety and for all purposes.

TECHNOLOGICAL FIELD

The present specification relates to the manufacturing of electronic components, and more specifically to the manufacturing of electronic components comprising on a same surface a large density of dipoles.

The present specification particularly applies to devices comprising two electronic components interconnected face to face with very small interconnection pitches, by means of a "flip-chip" type hybridization method. The present specification thus specifically applies in so-called chip-on-chip, chip-on-wafer, and wafer-on-wafer assemblies. For example, the present specification applies to illumination arrays and to hybrid imagers of very large dimensions and very small pitches.

BACKGROUND

The increase of the density of electronic components (diode, transistors, resistors, capacitors . . . ), that is, the number of components per surface area unit, in electronic circuits often comes up against the limited accuracy of manufacturing methods, particularly photolithography. This issue is all the more present for an electric component which comprises a plurality of successively-manufactured parts requiring an accurate positioning with respect to one another, for example, to avoid short-circuits. Further, the difficulty is all the greater when a plurality of connection levels are present in an electronic component, as is especially the case in an "island"-type dipole, for example, a photodiode (commonly called "mesa" photodiode), which requires applying a potential difference between the top and the foot of the island in order to operate.

Such issues are illustrated in FIGS. 1 and 2 in the specific case of a display and an array detector based on photodiodes.

Referring to FIGS. 1 and 2, conventionally, to form a matrix display (respectively detector) 20, a photodiode array 10 is formed in a first electronic emission (respectively detection) component 22 and current injection circuits 14 (respectively current collection circuits 18) are formed in a second electronic control (respectively read) component 24. The two components 22, 24 are manufactured independently from each other, and are then hybridized with each other by means of a so-called "flip-chip" technique. The hybridization enables to electrically connect electrodes 12 of photodiodes 10 with their respective injection circuits 14 (respectively collection circuits 18), by means of metal interconnects 24, which are usually also provided to secure components 22, 24 to each other. Electrodes 16 of photodiodes 10 are for example connected to a same electric potential by means of various techniques. According to a first technique, first component 22 comprises, inside thereof or on its surface 26 intended to be connected with component 24, a conductive or heavily-doped layer in contact with all the electrodes 16 of photodiodes 10. This technique is however crippling for arrays of photodiodes of large dimensions due to the series electric resistance implied by said layer.

Thereby, electrodes 12, 16 of photodiodes 10 are manufactured to be accessible from surface 26 of component 22 for their electric connection. At the same time, since a photodiode is essentially made of volumes of different materials stacked and/or aligned with one another, the manufacturing of photodiodes 10 advantageously uses etch techniques for automatically aligning a maximum number of components of the photodiodes. Such a manufacturing is illustrated in FIG. 2, which is a simplified cross-section view of a mesa-type photodiode 10 in a simplified PN junction form.

More specifically referring to FIG. 2, to manufacture photodiode 10, a volume of semiconductor material, for example, P-type doped, 30, is formed on a layer 32 of semiconductor material, for example, N-type doped, 32, to form a PN junction. An island of P-type semiconductor material 34 is then separated by depositing by photolithography an etch mask on P volume 30, for example, a $SiO_2$ mask deposited by a plasma-enhanced vapor phase deposition technique ("PECVD"), and by then applying an etching to form a trench 36 around volume 34 to reach N-type semiconductor material (see above) 32. For example, the etching is an inductively coupled plasma reactive ion etching ("RIE-ICP"). The etching is also applied to form a trench 38 of same height to isolate a P island 40 close to P island 34. A passivation layer 42, for example, made of SiN, is then deposited all over the surface of P islands 34, 40 and the surface of trenches 36, 38, for example, by means of a PECVD. Passivation layer 42, although it is optional, is considered as almost unavoidable. Not only does it correct the surface defects of P island 34, which defects are an important cause of unwanted recombinations of the charge carriers, but also does layer 42 enable to electrically isolate different elements of photodiode 10, and thus provides a protection against possible short-circuits during the subsequent deposition of the metal forming the electrodes of photodiode 10. The method of manufacturing photodiode 10 carries on with the forming of openings 44, 46 in passivation layer 42, both on top of P island 34 and at the bottom of trench 36 individualizing it, for example, by means of a RIE. A metal layer is then deposited full plate and it then etched to expose a first metallization 48 at the top of P island 34 forming a first electrode 12 of photodiode 10 as well as a second metallization 50, isolated from metallization 48, formed at the bottom of trench 36 and forming a second electrode 16 of photodiode 10. Such a structure thus allows a contacting, for example, by solder bumps 52 of component 24, of anode 12 and of cathode 16 substantially at the same level, which eases the hybridization with component 24. This structure is however highly area-consuming and the pitch of the array of photodiodes is substantially doubled, which thus limits the photodiode integration density.

To increase the integration density, it would thus be possible not to provide a contacting area for the cathode at the same level as the anode. P island 40 is thus suppressed and the contacting area of cathode 16 is formed directly at the bottom of trench 36. This type of structure is conventional. However, as described in document "*A Novel Blu-free Full-Color LED projector Using LED on Silicon Micro-Displays*" of Z. J. Liu et al., IEEE Photonics Technology Letters, vol. 25, No. 3, December 2013, this assumes providing connections 52 of different heights on component 24, which is particularly complex when a high-quality hybridization is desired. Further, when the cathode contacting area is formed directly at the bottom of trench 36, the access thereto becomes very difficult if the trench diameter is small. This thus requires at best very accurate alignment tools, which are thus very expensive. At worst, it is impossible to go below a given array pitch.

It may similarly be envisaged to decrease the width of trench 36 to decrease the pitch of the photodiode array. However, a problem is then posed in the forming of opening 46 providing access to the N layer for the cathode design. Further, by decreasing the width of trench 36, specific precautions should be taken so that metallization 50 does not overlap metallization 44. It is thus desirable to use manufacturing techniques far beyond their accuracy to guarantee the desired positioning of the photodiode elements with respect to one another. It can thus be noted that in the state of the art, such as for example described in document "*360 PPI Flip-Chip Mounted Active Matrix Addressable Light Emitting Diode on Silicon (LEDoS) Micro-Display*", of Z. J. Liu, Journal of Display Technology, vol. 9, No. 8, August 2013, or also described in the following document, the pitch of the array is in the order of some ten micrometers.

Of course, what has just been discussed, although it has been described in relation with diodes, applies to any type of electronic component, particularly dipoles, as soon as two electrodes of this component respectively associated with two different levels are desired to be connected. For example, the above-described issue applies to an array of photoconductors, for example, formed of a N/N+ or P/P+ stack, to an array of capacitors, an array of bolometers, an array of Zener diodes, etc.

SUMMARY OF THE DISCLOSURE

The present disclosure aims at providing a method of manufacturing an array of island dipoles each requiring two connections to different respective levels, enabling to easily connect the dipoles, including for array pitches considered small as compared with the accuracy of manufacturing techniques.

For this purpose, the disclosed embodiments provide a method of manufacturing an electronic component comprising a plurality of dipoles, each comprising an island solid with a base, a first electrode arranged at the top of the island and a second electrode arranged on the base, the method comprising:

forming, on the base, a thickness of a material forming the islands, said layer being etchable by means of a predetermined isotropic etching;

then forming, over the thickness of material forming the islands, solid patterns made of electrically-conductive material and inert to isotropic etching;

then, applying an etching on the thickness of the material forming the islands all the way to the base at least between said solid patterns to form islands topped with said solid patterns, said etching comprising at least one phase during which the predetermined isotropic etching is applied so that the solid patterns totally overhang the islands; and then, depositing electrically conductive material on top of and between the islands to form the first and second electrodes of the dipoles.

"Material inert to etching" here means that the material is substantially not etched by the etching during the forming of the islands. Particularly, speed V at which the material is etched is smaller than or equal to $1/10^{th}$ of the speed at which the material forming the islands for which the etching is intended is etched, and preferably smaller than or equal to $1/100^{th}$, particularly smaller than or equal to $1/1,000^{th}$ thereof.

"Anisotropic etching of a material" means a directional etching intended to etch the material in a specific direction, particularly an etching having an etching speed, in a direction normal to this specific direction, smaller than or equal to 10%, and preferably smaller than or equal to 1%, of the etching speed of the material in the specific direction.

"Isotropic etching of a material" means an etching for which the etching speed of the material is substantially uniform whatever the direction in the material, particularly an etching speed having its value varying by less than 10%, and preferably by less than 1%, according to the direction.

In other words, the isotropic character of the etching, which thus etches the layer of material in all directions, causes an overetching under the solid patterns. The islands are thus manufactured by means of a single etch step, while however being topped with protective "umbrellas". Such umbrellas naturally limit risks of subsequent short-circuits on deposition of the metallizations, so that it is no longer necessary to take subsequent specific measures for this purpose, including when an array of very small pitch is manufactured. For example, it is no longer necessary to provide a passivation layer. A considerable simplification of the manufacturing of dipoles and of their connections is thus obtained. Further, the metallization forming the lower-level connections is directly deposited on the base. Not only is the method further simplified, but also is an electrode naturally obtained in the form of a grid which surrounds the islands. This thus enables to provide a single contacting area for all the connections of the dipoles provided on a lower level, for example, the cathodes of photodiodes, at the periphery of the photodiode. The connection between two levels is thus easy and may be formed simply by providing a connection range of desired height. It can thus be noted that the method allows a self-alignment of the electrodes on manufacturing.

According to the described embodiments, the etching of the islands comprises, prior to the application of the isotropic etching, a phase during which an anisotropic etching is applied. In other words, the alternation of an anisotropic phase with an isotropic phase enables to adjust the volume of the islands, and thus to adjust the volume of active material of the dipoles.

More particularly, the anisotropic etching is applied to etch the thickness of material forming the islands along a height equal to h−δ where h is the final height of the islands and δ is a value greater than or equal to 0.1 micrometer, and preferably greater than or equal to 0.5 micrometer, and the isotropic etching is applied to etch the remaining height δ of the thickness of material forming the islands. Due to these values, it is possible to manufacture arrays of dipoles with a pitch smaller than 5 micrometers with a maximum island volume.

According to an embodiment, a passivation of the islands and of the base is carried out, said passivation being performed only after the deposition of the electrically-conductive material forming the first and the second electrodes. In other words, a passivation is used, but only once the dipoles have been formed with their connections. The passivation layer, advantageously used to limit surface recombinations of the islands in the context of photodiodes, for example, is no longer used to avoid short-circuits on manufacturing of the dipoles. There thus is an additional degree in the selection thereof.

According to an embodiment, the islands are gathered in a predetermined area of the base, and the deposition of the electrically conductive material to form the first and second electrodes comprises depositing a layer of said conductive material all over the support (that is, the surface defined by the islands and the base), and thus said area. As previously described, the full plate deposition greatly simplifies the method and enables to simply form an electrode in the form of a grid.

For example, the component having the component provided with islands hybridized thereto has hybridization elements enabling to compensate for level differences between the top of the islands and the bottom of the islands. Particularly, the hybridization enables to connect to the electrodes arranged at the top of the islands and at the trench bottom for the common contact, in a way for example similar to the hybridization described in document "*A Novel Blu-free Full-Color LED projector Using LED on Silicon Micro-Displays*" of Z. J. Liu et al.

For very fine pitches, it is advantageous to have the two types of connections (electrodes at the top of the islands and common gates at the bottom of the trenches) at the same level, that is, that defined by the electrodes at the top of the islands. Preferably, the connection located at the bottom of the islands is thus "raised" to the level of the electrodes arranged at the top of the islands.

For this purpose, according to an embodiment:

an additional solid pattern made of the electrically conductive material and inert to said etching is deposited over the thickness of material forming the islands;

the etching is also at least partially applied around the additional solid pattern to form a trench all the way to the base, the trench being overlooked by the additional solid pattern;

prior to the deposition of the electrically conductive material to form the first and the second electrodes of the dipoles, a local etching is applied to remove a portion of the overhang above the trench; and the electrically conductive material is also deposited on the additional solid pattern and in the trench.

An additional island, of same height as the islands forming the dipoles, is thus obtained once the etching has been performed. The removing of at least a portion of the overhang further enables to form an electric connection between the additional solid pattern and the bottom of the trench, and accordingly with the base. The additional island thus metalized then defines a connection terminal for the common gate around the islands.

According to an embodiment, the material forming the islands is a semiconductor material and the material forming the solid patterns is a metal.

According to an embodiment, the base is made of a semiconductor material having a predetermined conductivity type, and the islands each comprise a semiconductor portion having a conductivity type opposite to the conductivity of the semiconductor material of the base to form diodes with said base.

BRIEF DESCRIPTION OF THE DRAWINGS

The presently described embodiments will be better understood on reading of the following description provided as an example only in relation with the accompanying drawings, where the same reference numerals designate the same or similar elements, among which.

DETAILED DESCRIPTION

A first embodiment of the method of collective manufacturing of an array of island-shaped dipoles will now be described in relation with FIGS. 3 to 15, the array being intended to be subsequently hybridized with an external circuit for the electric connection of each dipole.

The method starts (FIG. 3) with the forming of a plate 60 containing all the active materials forming the dipoles. Plate 60 is divided between a first thickness 62 of value "h" where the islands will be formed and a second thickness 64 forming the base which will support the islands.

Figure 1:
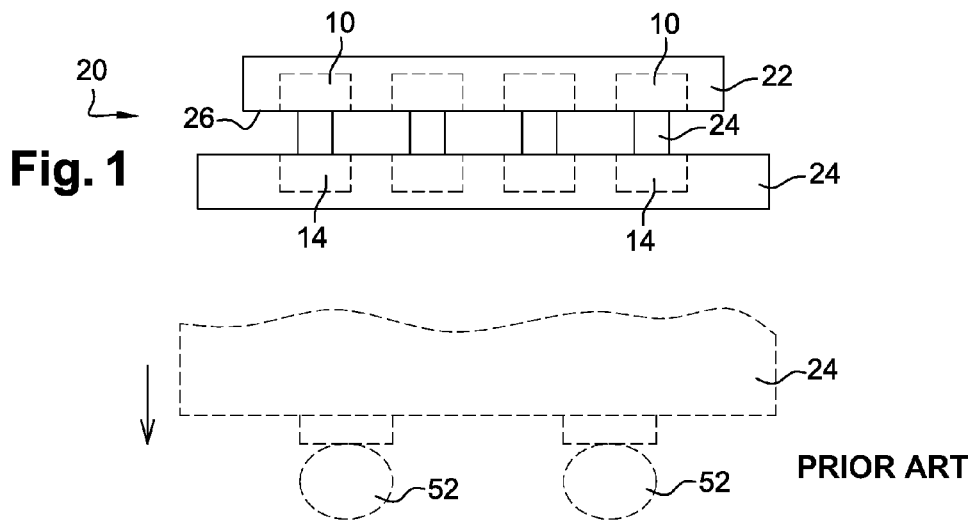
FIG. 1 is a simplified cross-section view of an array of photodiodes formed in a first component hybridized with a second component comprising an array for biasing/reading the photodiode array.
Figure 2:
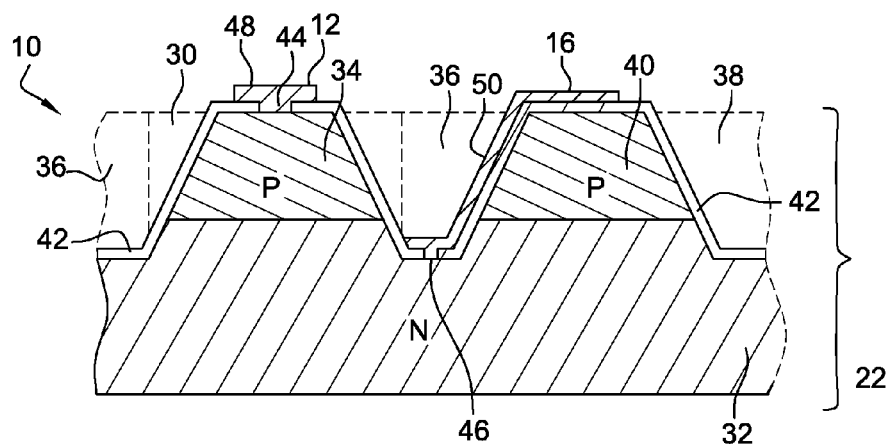
FIG. 2 is a simplified cross-section view of a MESA photodiode with two electrodes formed at the same level.
Figure 3:
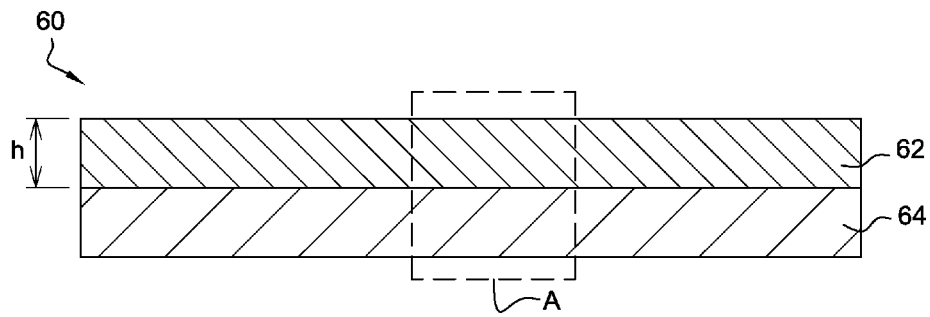
FIGS. 3 to 15 are simplified top and cross-section views illustrating a method of manufacturing an array of MESA dipoles.

Plates 60 used in the context of the manufacturing of an array of photodiodes are illustrated in FIGS. 4A-4D, which are for example detail views of box A of FIG. 3.

Figure 4A:
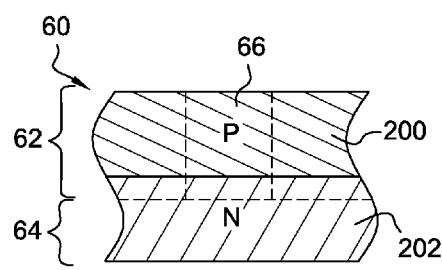
Figure 4B:
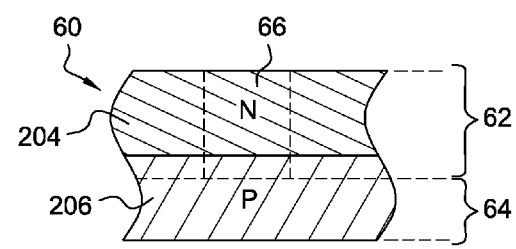
Figure 4C:
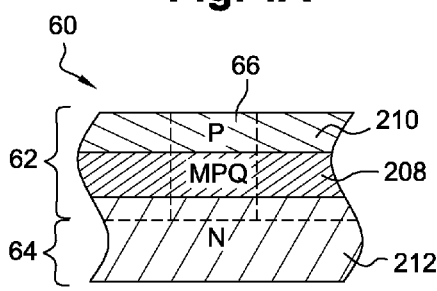
Figure 4D:
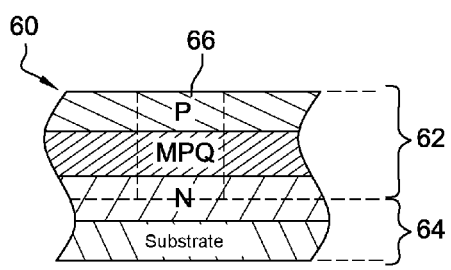
Figure 5:
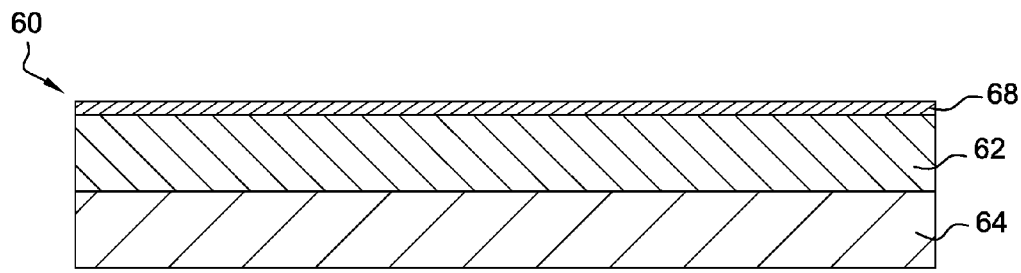

For example (FIG. 4A), plate 60 comprises a layer 200 of N-type semiconductor material having a layer 202 of P-type semiconductor material deposited thereon, the manufacturing of the islands comprising individualizing volumes 66 formed across the entire thickness of layer 202 and in a portion of layer 200. In FIG. 4B, thickness 62 to be etched corresponds to the thickness of a layer of N-type semiconductor material 204 and of a portion of the thickness of a P-type semiconductor layer 206 deposited on N layer 204. The structure of thicknesses 62, 64 may take multiple forms according to the desired photodiodes. For example (FIG. 4C), thickness 62 comprises a stack of layers forming quantum wells (MPQ) 208, a layer of P-type semiconductor material 210, and a portion of the thickness of a layer of N-type semiconductor material 212. Similarly (FIG. 4D), thickness 64 may be made of different materials, for example, a sapphire substrate having a layer of N-type semiconductor material deposited thereon. The forming of plate 60 is conventional and will thus not be described in further detail hereafter. Thus, thicknesses 62, 64 are illustrated in the form of "layers" in the drawings, but do not necessarily correspond to layers of material, as illustrated in FIGS. 4A-4D. Of course, thicknesses 62, 64 may also correspond to layers of material.

The method carries on (FIG. 5) with the deposition on plate 60, at least on a portion thereof intended for the forming of the islands, for example, all over plate 60, of a layer 68 of material, which is both electrically conductive and inert to at least one etching subsequently applied to individualize the islands. Advantageously, the etching speed of the material of layer 68 is smaller than or equal to $1/10^{th}$, and preferably smaller than or equal to $1/100^{th}$, particularly smaller than or equal to $1/1,000$, of the etching speed of the material of thickness 62. The thickness of layer 68 is advantageously greater than or equal to 10 nm to limit the risk for subsequently-formed overhangs to collapse under the weight of a subsequently deposited conductive material, as will be detailed hereafter.

Solid patterns 70 are then formed from layer 68 at the locations desired for the islands, the geometry of pattern 70 being selected according to the geometry desired for the islands (rectangular, square, circular, etc.). An additional pattern 72 is also formed at the periphery of the array of patterns 70 for electric connection purposes as will be explained hereafter. Patterns 70, 72 are for example obtained by superposing an etch mask 74 to layer 68 and by applying a dry anisotropic etching, particularly a plasma based or ion-beam etching, as known per se. Of course, solid patterns 70, 72 may be obtained differently, for example, by using a photolithography based on resist and on a chemical vapor deposition.

In a next step of the method, an etching is applied around solid patterns 70, 72 which are thus used as masks, to form trenches in thickness 62 all the way to thickness 64, and thus individualize islands forming part of the dipoles. More particularly, as illustrated in FIG. 7, which is a detail view of box B of FIG. 6, a first anisotropic etching 80 is first applied to etch a thickness h−δ of thickness 62. Etching 80 is thus calibrated to obtain a very strong etch selectivity such that the ratio of the etching speed of the material of layer 62 to the etching speed of the material of patterns 70, 72 is greater than 10, preferably greater than 100, preferably greater than 1,000.

At the end of etching 80, there thus remains in the trenches thus formed a residual portion δ of thickness 62.

A second isotropic etching 82 (FIG. 8) is then applied to remove remaining portion δ of thickness 62 remaining in the trenches. Since this second etching is isotropic, it thus also etches the material under solid patterns 70 by forming inclined island sides. More particularly, remaining thickness δ is selected so that its removal by the selected isotropic etching results in an overetching such that solid patterns 70, 72 totally overhang islands 84, 88, solid patterns 70, 72 extending beyond the foot of the islands by a width a measured in the plane of thickness 64. For example, in the context of tapered islands, the feet of islands 84 are disks of radius R and patterns 70 are disks of radius R+α, or in the context of islands having a square cross-section, the feet of islands 84 are squares having a side length R and patterns 70 are squares having side length R+α.

Advantageously, the two anisotropic and isotropic etchings are implemented in series in a same machine, which thus avoids having to manipulate the plate. Particularly, a RIE is used. As known, the etching combines two types of reaction between a plasma and the material to be etched. A first physical reaction of the plasma with the material, called "ionic", is highly directional and thus anisotropic. A second chemical reaction of the plasma with the material, called "chemical", is poorly directional and thus isotropic. Further, with this type of etching, it is possible to weight each of the reactions according to the rate of isotropy/anisotropy desired for the etching, which is one of the well known advantages of this type of etching.

According to the described embodiments, the etching is thus controlled:
according to a first phase during which the ionic process is favored to etch portion h−δ of thickness 62;
Then, according to a second phase during which the chemical process is favored to etch the remaining portion δ of thickness 62.

Figure 6:
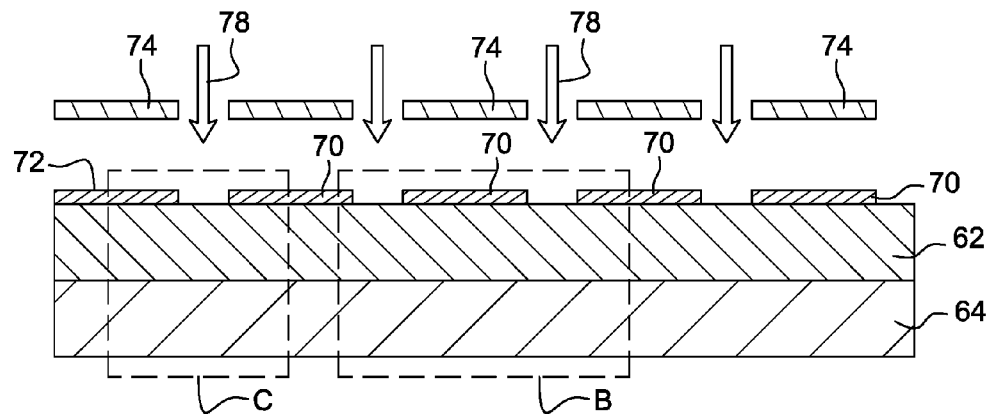
Figure 7:
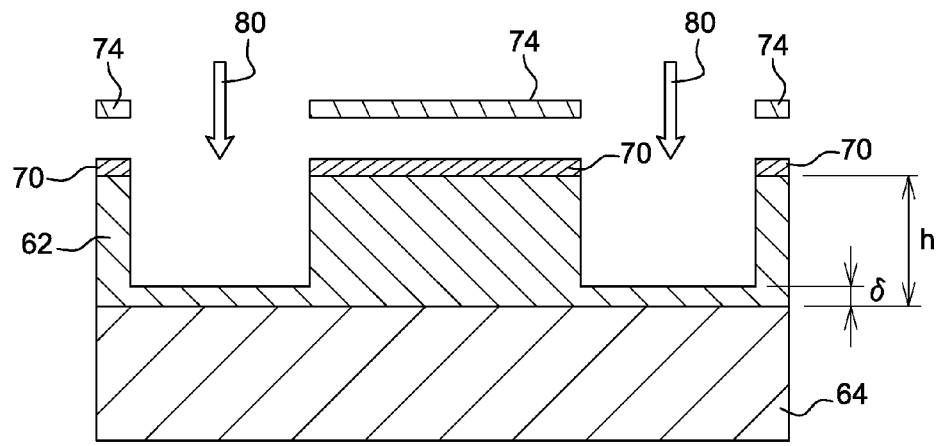
Figure 8:
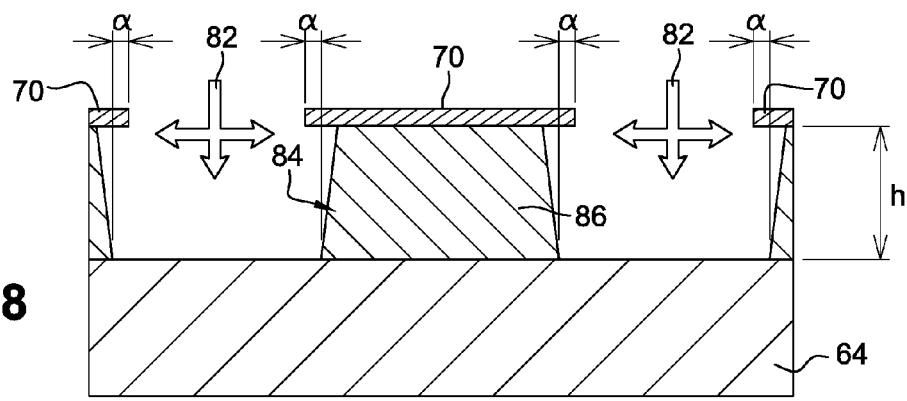
Figure 9:
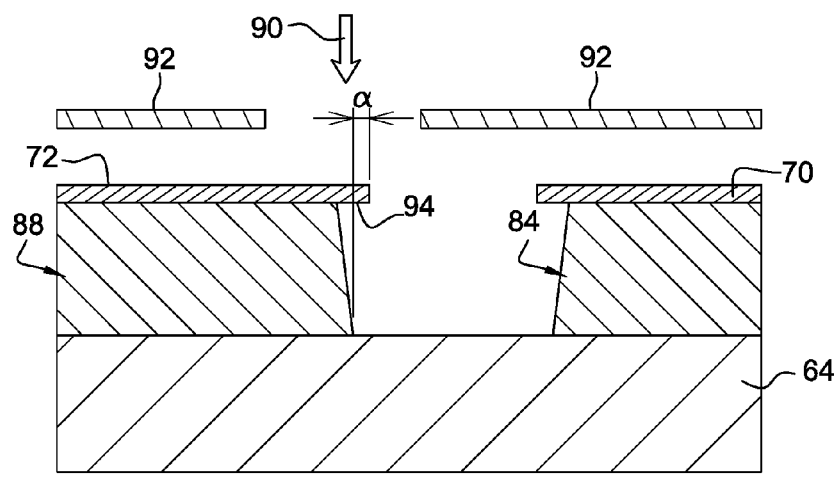

Referring to the detail view of FIG. 9, corresponding to box C of FIG. 6, the above-described etching has also formed an island 88, of same height as islands 84, overlooked by peripheral solid pattern 72.

Figure 10:
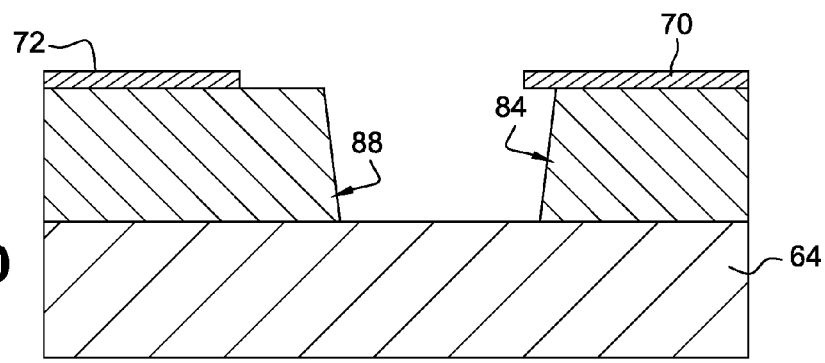
Figure 11:
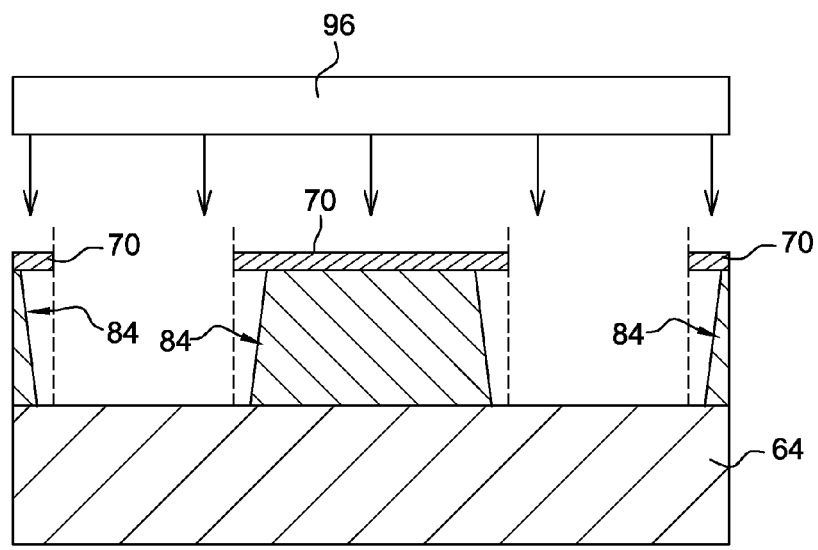

The method carries on with the application of an etching to a specific area of the component where the common electrode subsequently formed at the bottom of the trenches is desired to be continued further up, by a RIE 90 formed through a mask 92, to partially or totally remove portion 94 of pattern 72 which protrudes from island 88, as illustrated in FIG. 10.

Figure 12:
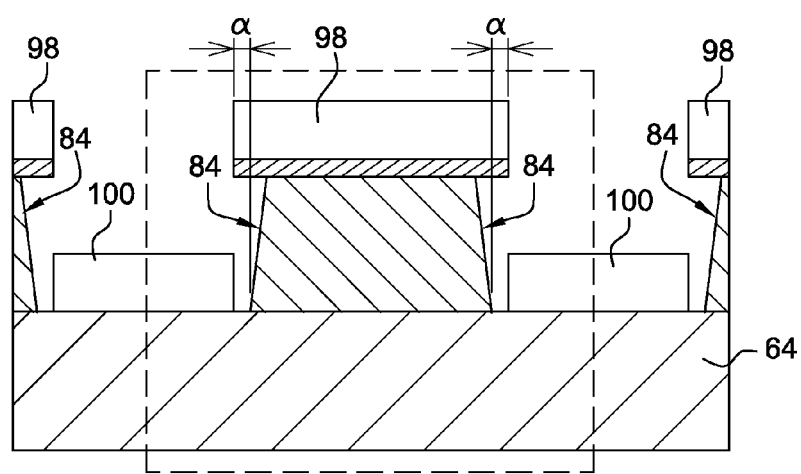

A deposition of conductive material 96 is then implemented (FIG. 11) over the entire surface of the obtained assembly (or "full plate" deposition), and accordingly on and around islands 84 and island 88. For example, a vapor phase deposition is used. Thus, overhang α of solid pattern 70 then plays the role of a mask by protecting the sides of islands 84 (FIG. 12). A first electrode 98 is thus obtained at the top of each island 84, here formed of solid pattern 70 and of a layer of conductive material 96, and a second common electrode 100 in the form of a grid formed of a layer of conductive material 96 and arranged at the foot of islands 84, with no short-circuit between the first and the second electrode 98, 100.

Further, electrodes 98, 100 are "automatically" aligned with islands 84. An array of dipoles, each formed of an island topped with a first electrode and with a second electrode arranged at its foot, is thus obtained. Further, overhang α is selected to be minimum, that is, just sufficient to obtain the desired mask effect. Thus, volume 84 which is the volume of active material of the dipoles, for example, the material involved in the PN junction of a photodiode, is maximum.

Figure 13:
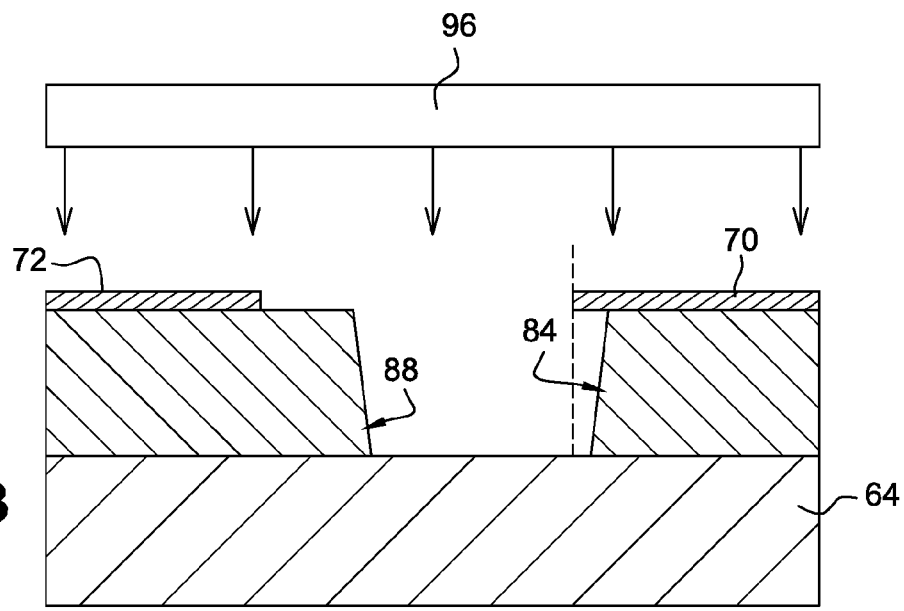
Figure 14:
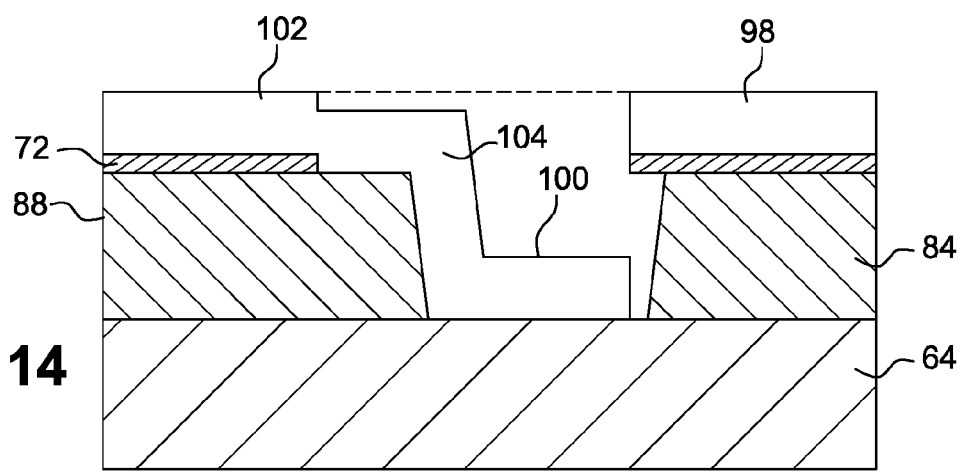

In parallel, referring to the detail views of FIGS. 13 and 14, due to the lack of overhang on peripheral island 88 and the inclination of the sides of islands 88, the deposition of conductive material 98 (FIG. 13) results in forming an electrode 102 on the top of island 88 which continues in a portion 104 on the side of island 88 and in second common electrode 100 of the dipoles (FIG. 14). Particularly, electrode 102 is at the same level as first electrodes 98 of the dipoles.

Figure 15:
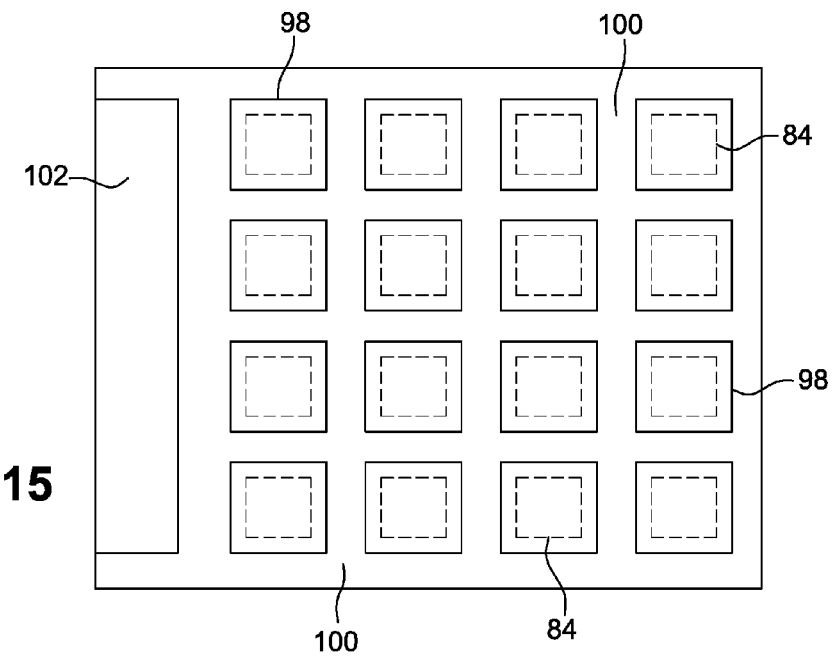

Referring to the top view of FIG. 15 of the electronic component thus obtained, with square solid patterns 70 and additional rectangular solid pattern 72, it can thus be noted that second electrode 100 forms a gate around the islands which are in electric continuity with peripheral electrode 102. The dipoles are thus individually driven via their first electrodes 98, while second electrode 100 enables to take to the same potential, for example, the common of the circuit. Further, for the hybridization, first electrodes 98 and peripheral electrode 102 are at the same level. It is thus not necessary to provide interconnection elements of different heights for the hybridization.

Figure 16:
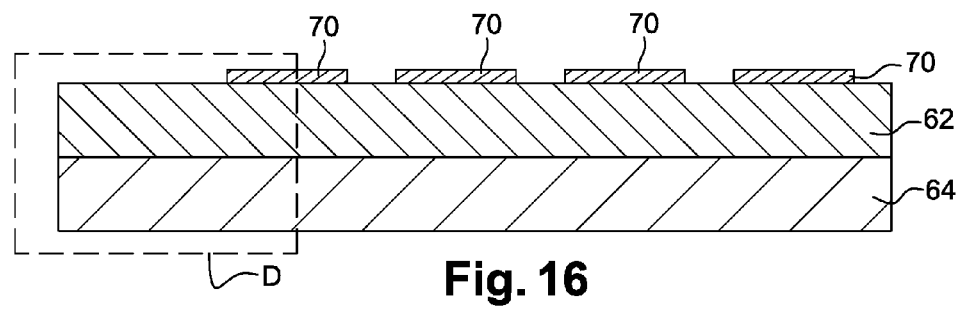
FIGS. 16 and 17 are simplified views illustrating an alternative manufacturing of the common electrode for the contacting area of the electrode in the form of a grid formed of the MESAs.
Figure 17:
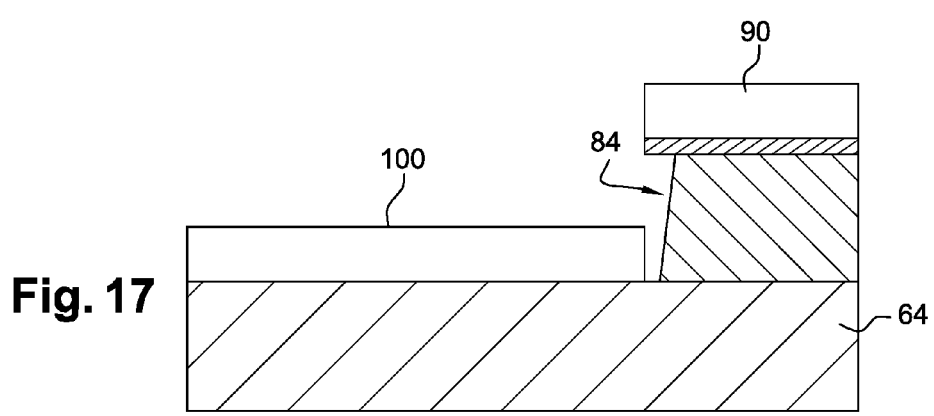

Although it is advantageous, taking the connections to a same level is optional. Referring to FIGS. 16 and 17, an alternative embodiment differs from the method described hereabove in that additional solid pattern 72 is omitted (FIG. 16) and in that there thus exists no etch step such as described in FIGS. 9 and 10. The deposition of conductive material 96 thus results in an electrode 100, which continues at the periphery of the electronic component thus formed (detail view of FIG. 17 corresponding to box D). Either an interconnection element of greater height is provided for the connection of electrode 100, or a conductive pattern compensating for the level difference is deposited on electrode 100.

Figure 18:
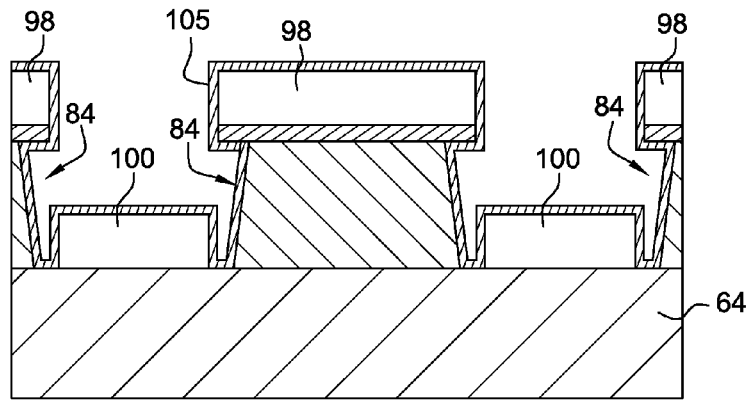
FIG. 18 is a simplified view illustrating the conformal passivation of the array of dipoles implemented after the electrodes have been formed.

It may be noted that at this stage, no passivation of the dipoles have been performed yet. Advantageously, the passivation occurs only once the dipoles and their electrodes have been manufactured. More particularly, referring to FIG. 18, a passivation layer 105 is deposited full plate by means of a conformal isotropic deposition technique, for example, a chemical vapor deposition, particularly an atomic layer deposition of $Al_2O_3$, to obtain a passivation layer which covers all the surfaces of the dipoles, and thus the sides thereof. Passivation layer 105 thus also covers electrodes 98, 100 of the dipoles. Advantageously, the hybridization then uses a hollow insert, which is force fit into each electrode 98 and peripheral electrode 102 while breaking passivation layer 105.

Figure 19:
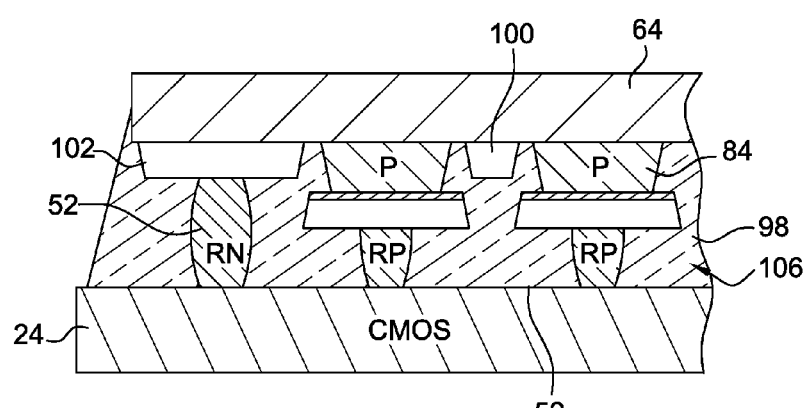
FIGS. 19 and 20 are simplified views illustrating a passivation implemented after the hybridization of the electronic components.
Figure 20:
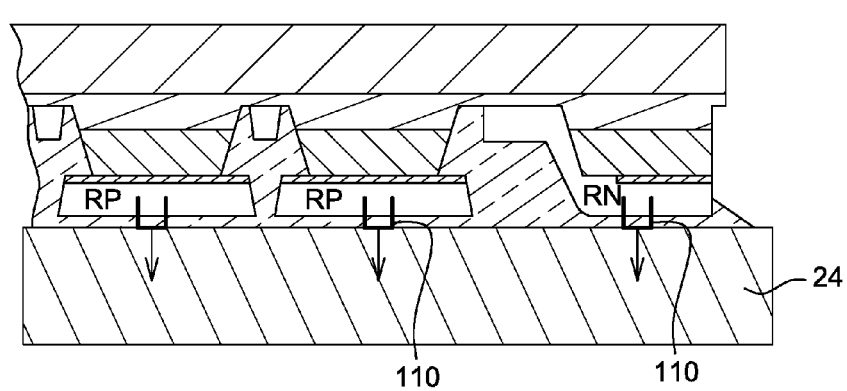

As a variation, passivation layer 105 is omitted and the passivation is implemented, only once the hybridization has been performed by introducing between the two hybridized components a filling material 106 having a passivation property and having a high electric resistivity (commonly called "underfill") For example, the underfill fills the space between the hybridized components by means of solder bumps 52 (FIG. 19) or by means of hollow inserts 110 respectively inserted into electrodes 98, 102 (FIG. 20). For example, the underfill is an epoxy resin of low viscosity such as Epotek© 353 ND or EPOTEK 301 and having an electric volume resistivity greater than $1.8.10^{11}$ ohm·cm after cross-linking.

As previously described, the material of solid patterns 70 and 72 is selected both to be conductive and to be inert at least to the isotropic phase of the etching for forming the islands, and preferably inert to the entire etching.

Particularly, for a thickness 62 to be etched, formed of semiconductor material GaN, InGaN, InGaAs, CdHgTe, InP, SnPb, Ge, Si . . . and, more generally, all conventional materials and stacks enabling to form "OPTICAL" detection or emission circuits, constructed from alloys or stacks of materials originating from columns II to VI (group III-V and group II-VI semiconductors) and for an isotropic wet chemical, gas, or physical etching or the coupling of the three plasmas, material 68 of solid patterns 70, 72 is selected to be made of metal, particularly selected from among Ag, Al, Ni, Pt, Ni, Ti and alloys of Ti (TiN, TiW, . . . ), Pd, Au, W and alloys of W (WSi, WN, . . . ) and Co, and preferably Ni or Pt.

Material 68 may also be a multilayer of these metals and alloys. Further, these materials are also inert to an adapted anisotropic etching.

Material 68 of the patterns may also be selected according to the implemented hybridization. For example, gold, platinum, and nickel are preferred when electrodes 98, 102 are made of a so-called "solder" material, for example, indium, an indium alloy, tin or a tin alloy, which materials are currently used in the case of flip-chip assemblies.

For example, titanium and titanium alloys are preferred if electrodes 98, 102 are made of aluminum since they provide a fine bonding of the final aluminum deposit and are generally used for this purpose as an aluminum "bonding layer" before the deposition due to their good affinity for aluminum.

Further, material 68 of patterns 70, 72 may also be selected according to the application targeted by the dipole array. For example, some displays based on photodiodes are designed to emit light from their back side, that is, through thickness 64 which is selected to be transparent to the visible emission wavelength of photodiodes. Material 68 of patterns 70 is thus selected to have a strong reflective power at this wavelength. For example, the material is silver.

Of course, material 96 of electrodes 98, 100, 102 may also be identical to material 68 of solid patterns 70, 72.

As concerns width a of the overhang between the foot of islands 84 and solid patterns 70, the inventors have observed that a width greater than 0.1 micrometer, and particularly greater than 0.5 micrometer, enables to efficiently protect the sides of the islands on deposition of electrodes 98, 100. Further, beyond 1 micrometer, no specific gain in terms of protection can be observed.

Figure 21:
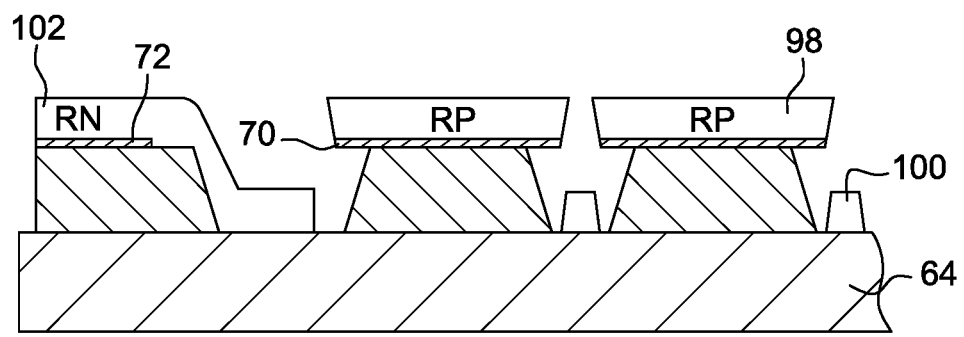
FIG. 21 is a simplified view illustrating a numerical example of an array of dipoles manufactured according to the method.

FIG. 21 illustrates a numerical example of an array of photodiodes manufactured according to the previously-described method. The layer to be etched is a layer such as described in FIG. 4C, formed by epitaxial growth of the layers forming it, having a 1,000-nanometer thickness. Patterns 70 are squares having a side length equal to 2,300 nanometers and having a thickness of 100 nanometers, this thickness thus being also that of peripheral pattern 72, the distance separating patterns 70 being equal to 700 nanometers. The material of patterns 70, 72 is nickel or gold and the metal of electrodes 98, 100, 102 is a solder material for a hybridization by insertion, as described hereafter, having a 500-nanometer thickness. Overhang α is equal to 300 nanometers. The array of photodiodes thus obtained thus has a pitch of 3,000 nanometers, that is, a small pitch (smaller than 5 micrometers) as compared with the pitches of arrays of photodiodes of the state of the art, which are greater than 10 micrometers.

Specific embodiments have been described, particularly relating to the applied etching. Of course, any type of etching enabling to form an overhang protecting the sides and the feet of the islands during a subsequent deposition of material is appropriate.

For example, it is possible to alternate a plurality of anisotropic etch phases with a plurality of isotropic etching steps in dedicated sequences to obtain specific etch profiles and more finely control the shape of overhang α.

Similarly, it is possible to only apply an isotropic etching to individualize the islands by setting the etch parameters to carry out a controlled isotropy to obtain the desired overhang, for example, by controlling the isotropy factor I=α/h.

Similarly, it is possible to use different etchings, for example, a RIE for the anisotropic phase and a wet chemical etching for the isotropic phase.

An application to the forming of a MESA-type photodiode array has been described. Of course, the described embodiments apply to the manufacturing of any type of MESA-type dipole requiring the connection to two levels. For example, the above-described issue applies to an array of photoconductors, for example, formed of a N/N+ or P/P+ stack, to an array of capacitors, an array of bolometers, an array of Zener diodes, etc.

The described embodiments have at least the following advantages:

the manufacturing of "hybridizable" optical devices (emission or detection chips) of small pitch, and of large size (three-color array, projectors, µdisplay, IR, visible, X, VCSEL emitter array . . . );

the possibility of using reliabilizing techniques of the state of the art. Thus, the final assembled device may be reliabilized by coating or by conformal passivation deposition;

an easy contacting of the common pad, particularly by having a same connection level.

What is claimed is:

1. A method of manufacturing an electronic component comprising a plurality of dipoles, each comprising an island solid with a base, a first electrode arranged at the top of the island and a second electrode arranged on the base, the method comprising forming on the base a thickness of a material forming the islands, said thickness being etchable by means of a predetermined isotropic etching;

then, forming, over the thickness of material forming the islands, solid patterns made of electrically-conductive material and inert to isotropic etching;

then, applying an etching on the thickness of the material forming the islands all the way to the base at least between said solid patterns to form islands topped with said solid patterns, said etching comprising at least one phase during which the predetermined isotropic etching is applied so that the solid patterns totally overhang the islands; and then, depositing electrically conductive material on top of the overhanging solid patterns and between the islands to form the first and second electrodes of the dipoles.

2. The electronic component manufacturing method of claim 1, wherein the etching of the islands comprises, prior to the application of the isotropic etching, a phase during which an anisotropic etching is applied.

3. The electronic component manufacturing method of claim 2, wherein:

the anisotropic etching is applied to etch the thickness of material forming the islands along a height equal to h−δ where h is the final height of the islands and δ is a value greater than or equal to 0.1 micrometer, and preferably greater than or equal to 0.5 micrometer; and the isotropic etching is applied to etch the remaining height δ of the thickness of material forming the islands.

4. The electronic component manufacturing method of claim 1, comprising a passivation of the islands and of the base, said passivation being performed only after the deposition of the electrically-conductive material forming the first and the second electrodes.

5. The electronic component manufacturing method of claim 1, wherein the deposition of the electrically-conductive material to form the first and second electrodes comprises depositing a layer of said conductive material all over the surface defined by the islands and the base.

6. The electronic component manufacturing method of claim 1, wherein:

an additional solid pattern made of the electrically-conductive material and inert to said etching is deposited over the thickness of material forming the islands;

the etching is also at least partially applied around the additional solid pattern to form a trench all the way to the base, the trench being overlooked by the additional solid pattern;

prior to the deposition of the electrically conductive material to form the first and the second electrodes of the dipoles, a local etching is applied to remove at least a portion of the overhang above the trench; and the electric conductor material is also deposited on the additional solid pattern and in the trench.

7. The electronic component manufacturing method of claim 1, wherein the material forming the islands is a semiconductor material and the material forming the solid patterns is a metal.

8. The electronic component manufacturing method of claim 1, wherein the base is made of a semiconductor material having a predetermined conductivity type, and wherein the islands each comprise a semiconductor portion having a conductivity type opposite to the conductivity of the semiconductor material of the base to form diodes with said base.

* * * * *